United States Patent
Ohashi et al.

(10) Patent No.: US 9,358,939 B2
(45) Date of Patent: Jun. 7, 2016

(54) RELAY BUSBAR DEVICE WITH BUILT-IN CURRENT SENSOR FOR VEHICLE

(71) Applicants: SUMITOMO ELECTRIC INDUSTRIES, LTD., Osaka (JP); SUMITOMO WIRING SYSTEMS, LTD., Mie (JP); AUTONETWORKS TECHNOLOGIES, LTD., Mie (JP)

(72) Inventors: Shingo Ohashi, Osaka (JP); Takeshi Baba, Osaka (JP); Izumi Suzuki, Mie (JP); Tomoyuki Kondo, Mie (JP)

(73) Assignees: SUMITOMO ELECTRIC INDUSTRIES, LTD., Osaka (JP); SUMITOMO WIRING SYSTEMS, LTD., Mie (JP); AUTONETWORKS TECHNOLOGIES, LTD., Mie (JP)

( * ) Notice: Subject to any disclaimer, the term of this patent is extended or adjusted under 35 U.S.C. 154(b) by 778 days.

(21) Appl. No.: 13/774,638

(22) Filed: Feb. 22, 2013

(65) Prior Publication Data

US 2013/0214593 A1      Aug. 22, 2013

(30) Foreign Application Priority Data

Feb. 22, 2012   (JP) ................................. 2012-036323

(51) Int. Cl.
*B60R 16/03* (2006.01)
*G01R 15/20* (2006.01)

(52) U.S. Cl.
CPC .............. *B60R 16/03* (2013.01); *G01R 15/207* (2013.01)

(58) Field of Classification Search
None
See application file for complete search history.

(56) References Cited

U.S. PATENT DOCUMENTS

| 7,717,747 | B2 | 5/2010 | Korich et al. | |
| D697,032 | S * | 1/2014 | Ohashi | D13/159 |
| 2012/0063188 | A1 | 3/2012 | Hotta et al. | |
| 2013/0256110 | A1* | 10/2013 | Chiba | H01H 23/145 200/556 |
| 2015/0375634 | A1* | 12/2015 | Kim | G01R 19/16542 307/131 |

FOREIGN PATENT DOCUMENTS

| JP | 2008-114839 A | 5/2008 |
| JP | 2011-015586 A | 1/2011 |
| JP | 2011-209158 A | 10/2011 |

* cited by examiner

*Primary Examiner* — Jared Fureman
*Assistant Examiner* — Aqeel Bukhari
(74) *Attorney, Agent, or Firm* — McDermott Will & Emery LLP

(57) ABSTRACT

A relay busbar device of one embodiment is a relay busbar device with a built-in current sensor, which is interposed between a motor casing and an inverter casing, and includes a relay busbar both ends of which enter into both of the casings; a resin plate, through which the relay busbar penetrates, and which is interposed between the two casings; a magnetic core, positioned within the resin plate and surrounding the relay busbar; and a magnetic sensor provided in a removed portion of the magnetic core. The relay busbar is mold-formed integrally with the resin plate during resin molding thereof, and changes in magnetic field occurring in the removed portion due to the current flowing in the relay busbar are detected by the magnetic sensor, and the value of the current flowing in the relay busbar is measured.

8 Claims, 13 Drawing Sheets

(a)

(b)

(c)

RELAY BUSBAR DEVICE WITH BUILT-IN CURRENT SENSOR FOR VEHICLE

CROSS-REFERENCE RELATED APPLICATIONS

This application is based upon and claims the benefit of priority from Japanese Patent Application No. 2012-036323, filed on Feb. 22, 2012, the entire contents of which are incorporated herein by reference.

BACKGROUND OF INVENTION

1. Field of Invention

This invention relates to a relay busbar device with a built-in current sensor for vehicles, which forms a power circuit between a traction motor and an inverter in a vehicle equipped with the motor such as an electric vehicle (EV), fuel cell vehicle (FCV), hybrid vehicle (HV), and plug-in hybrid vehicle (PHV, PHEV), and which incorporates therein a sensor to detect the current flowing in the power circuit.

2. Related Background Art

Among vehicles equipped with this type of traction motor (hereafter "motor"), the power terminals of motors (including motor-generators) and generators and the inverter power terminals of power control units (PCUs) are connected using a relay busbar, and a power circuit (current path) is thereby formed between the motor or similar and the inverter; power is supplied from a battery to the motor via the PCU using the current path (relay busbar), and generated power is supplied from the generator via the inverter (PCU) to the battery using the current path. At this time, a current sensor is attached to the relay busbar, and this current sensor is used to measure the current flowing in the relay busbar; and feedback power (current) control is performed based on comparison of that measured value with a current instruction value, and the motor is controlled at the desired revolution rate and torque in the PCU.

The current sensor normally comprises a ring-shape magnetic core with a portion removed, such as a U-shape core or similar, surrounding the relay busbar, and a magnetic sensor provided in the core removed portion (gap); the magnetic flux occurring in the removed portion due to current flowing from the inverter to the motor via the relay busbar is detected by the magnetic sensor, and the detected value (measured value) is sent to the PCU. This current sensor is attached to the relay busbar, and so is built into the relay busbar device.

Such a power circuit between the motor (including a motor-generator or generator; similarly below) and the inverter has conventionally been formed using a wire harness (cables); positioning the wire harness requires positioning space, and the need for the positioning process has been a cause of increased costs.

Hence connector structures have been suggested which form the power circuit, and in which a relay busbar device with a built-in current sensor for a vehicle, with a current sensor built into the power circuit, makes connections by fitting motor power terminals and inverter terminals into the relay busbar device (Japanese Patent Application Laid-open No. 2011-15586 and Japanese Patent Application Laid-open No. 2008-114839).

A structure has also been suggested in which a relay busbar penetrates a resin molded member, and the current sensor is built into the resin molded member (Japanese Patent Application Laid-open No. 2011-209158).

SUMMARY OF INVENTION

Conventional inverters and motors are installed at a distance within a vehicle body, and the inverter casing and motor casing are also distant, so that the relay busbar device has been mounted on the inverter casing or on the motor casing, or has been mounted on a frame separate from both casings.

At present, as hybrid vehicles and other vehicles are made smaller, there is also less space within vehicles for installation of this type of inverters and motors, and efforts are being made to reduce the volume (space) occupied by the inverter and motor by housing the inverter and motor in the same casing, by placing the two casings in contact, or by similar means.

When attempting to reduce the volume occupied by the inverter and motor, for a conventional relay busbar device the connection of the relay busbar with the inverter output terminal or with the motor input terminal employs a connector structure (see FIG. 1 and FIG. 2 of Japanese Patent Application Laid-open No. 2011-15586 and FIG. 5 of Japanese Patent Application Laid-open No. 2008-114839), and the structure becomes complicated; in addition, further reduction in size is demanded. In the relay busbar device with a current sensor of Japanese Patent Application Laid-open No. 2011-209158 also, the entire current sensor is resin-molded, and the relay busbar penetrates into the molding, and the reductions in size and cost are not adequate.

An object of this invention is to reduce the size of a relay busbar device with a built-in current sensor for the power circuit of the inverter and motor in a vehicle adopting a structure in which the inverter and motor are housed in the same casing, or in which the two casings are in contact, or similar.

In order to attain this object, the relay busbar and core base are formed of a resin plate in this invention.

Because the plate is plate-shaped, in a vehicle adopting a structure in which the inverter and motor are housed in the same casing or the two casings are in contact, a large installation space is not required within the casing, and the plate can be easily interposed between two casings, thereby enabling the installation space of two casings to be reduced.

Next, in this invention, the relay busbar is mold-formed integrally with the resin plate during resin molding thereof.

The relay busbar is a member which is central to the positional relationship of the current sensor to the core and to positioning for connection of the inverter terminal and the motor terminal; if the resin plate is positioned and fastened relative to the casings, positioning of the resin plate with the integral relay busbar is also determined, and positioning with the core, as well as positioning of the connection of the inverter terminal and motor terminal, are also set as a consequence.

As a specific configuration example of this invention, in a relay busbar device with a built-in current sensor, which is interposed between a motor casing and an inverter casing, a configuration is adopted comprising a relay busbar both ends of which enter into both of the casings, a resin plate interposed between the two casings with the relay busbar penetrating therethrough, a magnetic core positioned within the resin plate and surrounding the relay busbar, and a magnetic sensor provided in a removed portion of the core, the relay busbar being mold-formed integrally with the resin plate during resin molding thereof, and incorporating therein a current sensor in which a change in magnetic field occurring in the removed portion due to current flowing in the relay busbar is detected by the magnetic sensor and a value of the current flowing in the relay busbar is measured. In the invention with this configuration, a motor is taken to include motor-generators and generators which are connected to the inverter and power (current)-controlled.

In this configuration, as explained previously, the invention is adopted in a vehicle which adopts a structure in which the inverter and motor are housed in the same casing, or the two casings are in contact; hence the above-described "interposed between the motor casing and the inverter casing" includes, in a case where the inverter and the motor are housed in the same casing, "a mode in which the resin plate is mounted on the casing, or mounted on another member" within the casing, and in a case where the motor casing and the inverter casing are separate, "a mode in which the two casings are integrated in contact with a resin plate interposed therebetween".

The face of the resin plate on the motor side is provided with a packing surrounding a circuit substrate on which are mounted the relay busbar, the magnetic core and the magnetic sensor; it is preferable that motor lubricating oil is prevented from leaking from within the motor to the outside by this packing. Further, similar packing can be provided on the face of the resin plate on the side opposite this packing.

As the above magnetic sensor, a Hall element, Hall IC, magnetoresistance effect element, or another well-known device of the prior art can be adopted as appropriate; it is preferable that the magnetic sensor be provided on the circuit substrate. The circuit substrate with the magnetic sensor mounted is built into the resin plate, and can also be fastened to the resin plate with screws, or covered with a resin cover and fastened to the resin plate with the resin cover pressed into the resin plate.

The magnetic core can be formed from laminated steel plate, or can be formed of a compacted powder magnetic member, formed by pressure-molding magnetic particles which are individually insulated. A compacted powder core has such advantages as exhibiting a good electromagnetic transducing characteristic at high frequencies, a high degree of freedom in molding, and easy reduction of size, and in addition separation of the material when disposing of the relay busbar is easy, facilitating recycling. Further, compacted powder affords high dimensional precision, and is advantageous when mounting by fitting into a resin plate. Similarly to the relay busbar, the core can be integrally mold-formed when resin-molding the resin plate, or can be fitted into or otherwise mounted on the resin plate.

When resin-molding the core and relay busbar together with the resin plate, it is preferable that interface sealing material be applied to the surfaces of the core and relay busbar, so that close adhesion between the relay busbar, core, and resin plate is secured.

DESCRIPTION OF EMBODIMENTS

Figure 1:
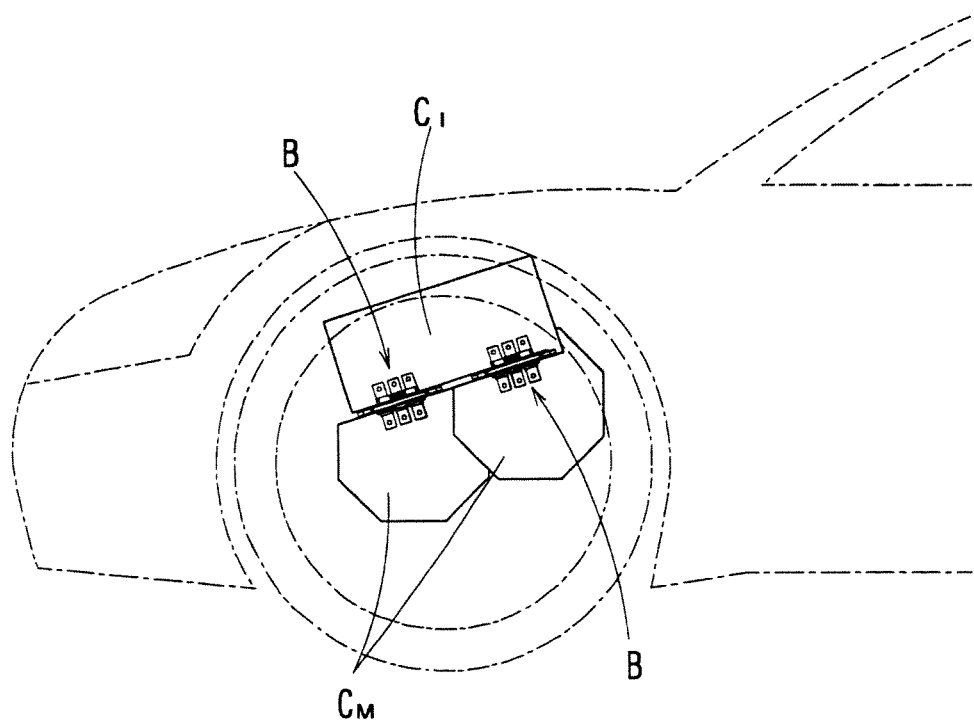
FIG. 1 is a summary diagram of a state in which the relay busbar device of one embodiment of the invention is built into a vehicle.
Figure 2:
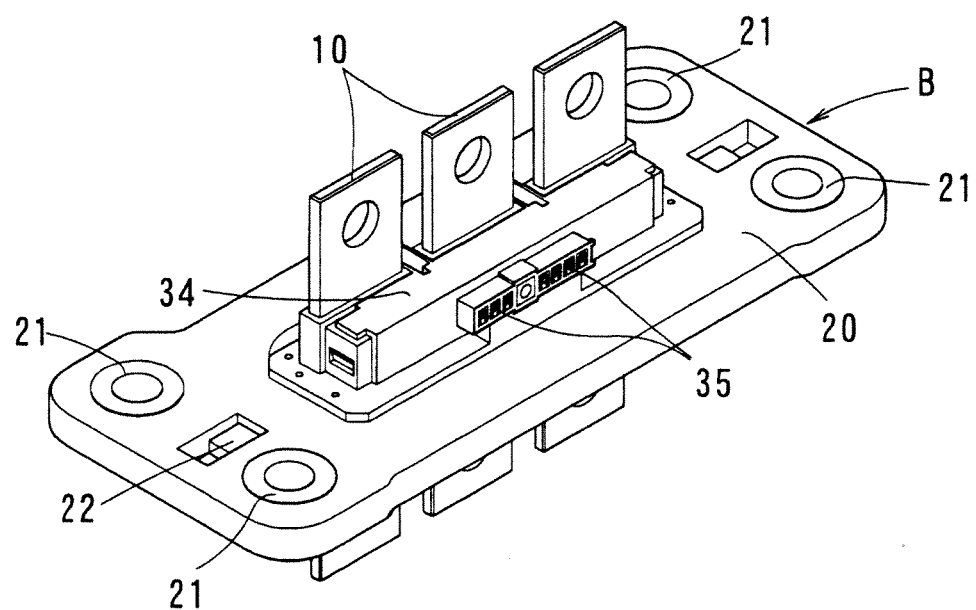
FIG. 2 is a perspective view of the relay busbar device.
Figure 3:
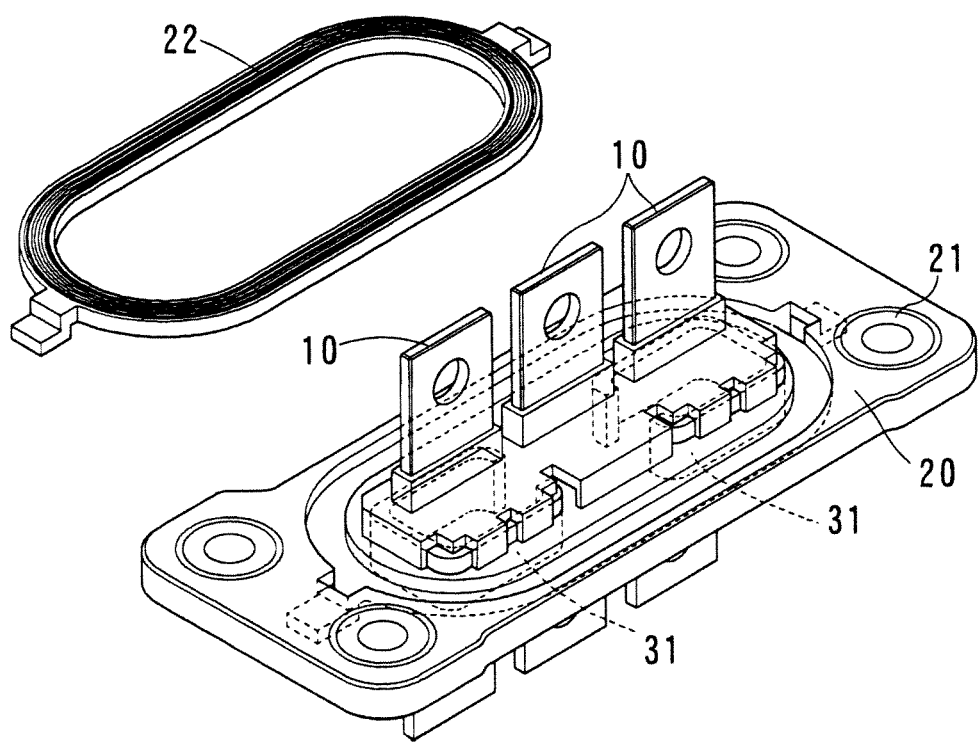
FIG. 3 is a perspective view of a portion of the relay busbar device, removed and seen from below.
Figure 4:
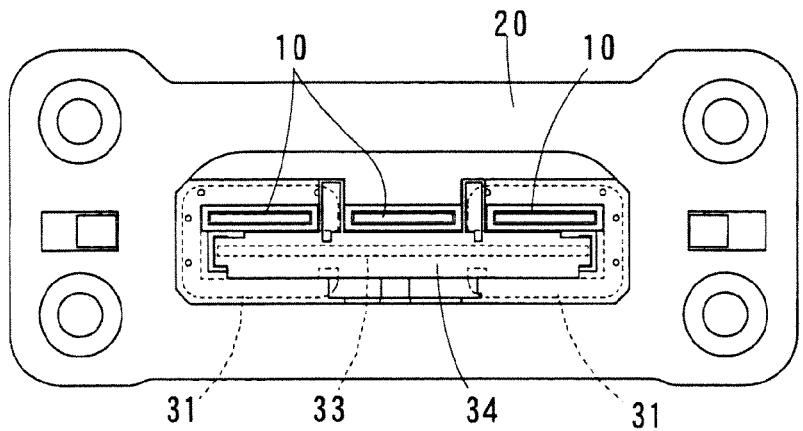
FIG. 4 shows the relay busbar device, in which (a) of FIG. 4 is a plane view, (b) of FIG. 4 is a partially sectioned front view, and (c) of FIG. 4 is a bottom view.
Figure 4:
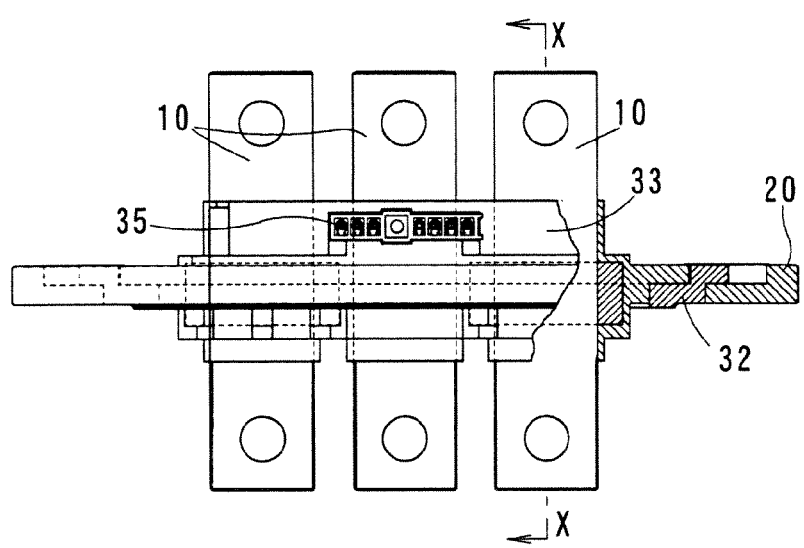
Figure 4:
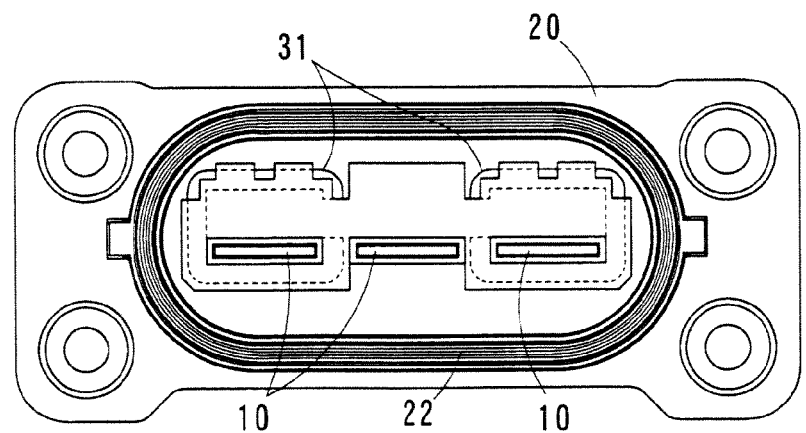
Figure 5:
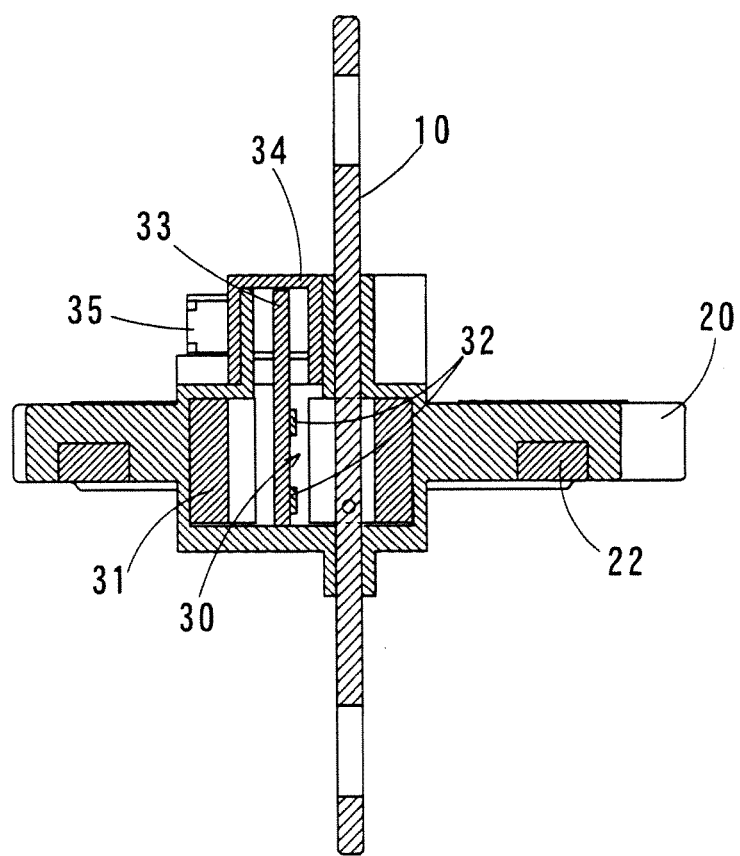
FIG. 5 is a cross-sectional view along line X-X in (b) of FIG. 4.
Figure 6:
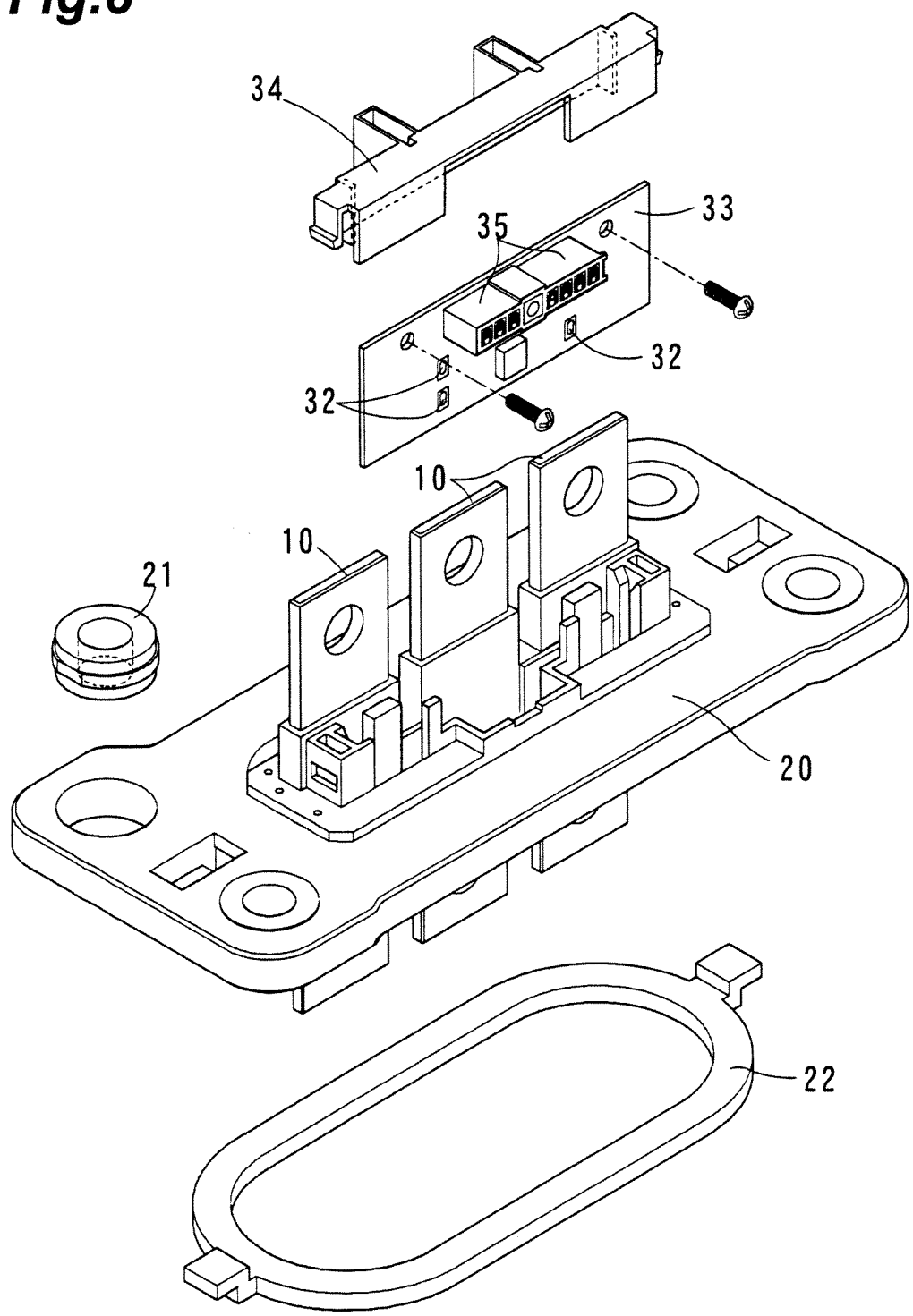
FIG. 6 is an exploded perspective view of the relay busbar device.
Figure 7:
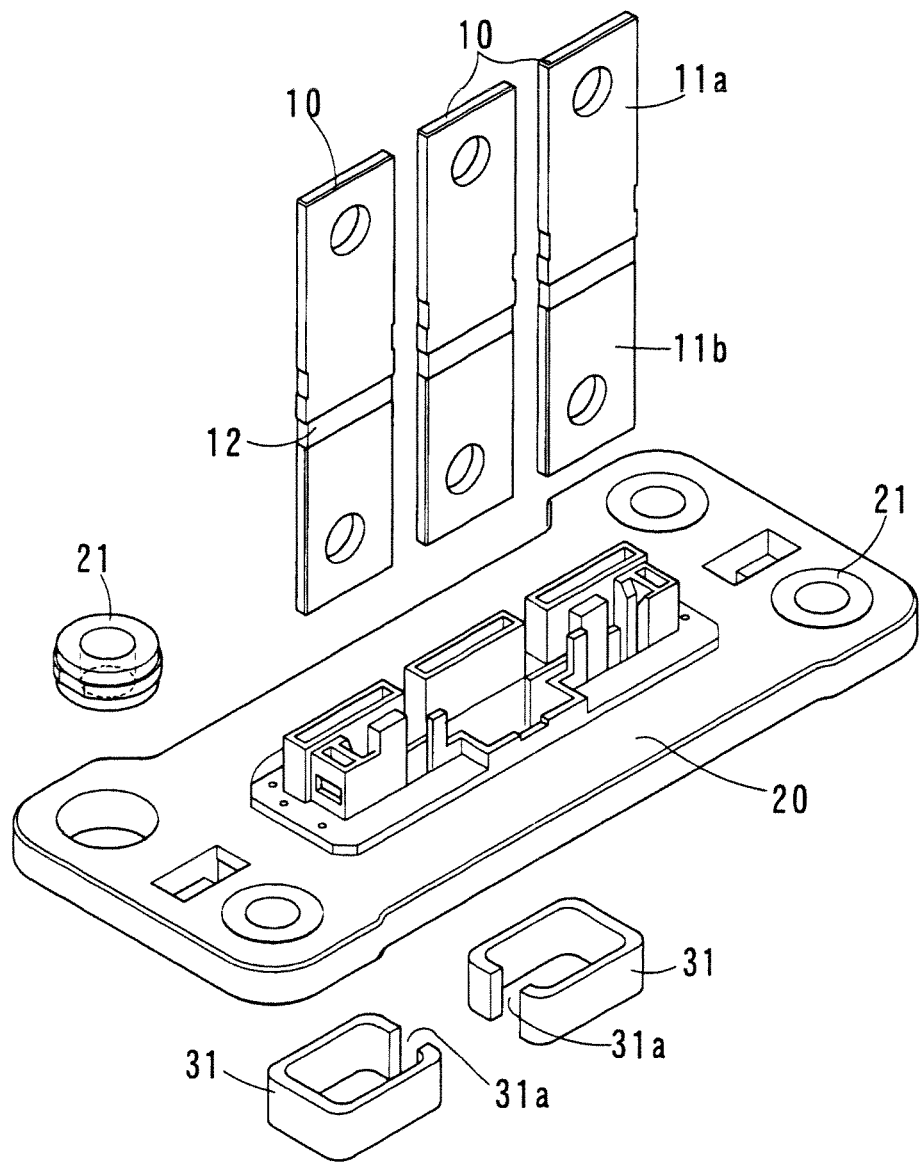
FIG. 7 is an exploded perspective view of principal portions of the relay busbar device.
Figure 8:
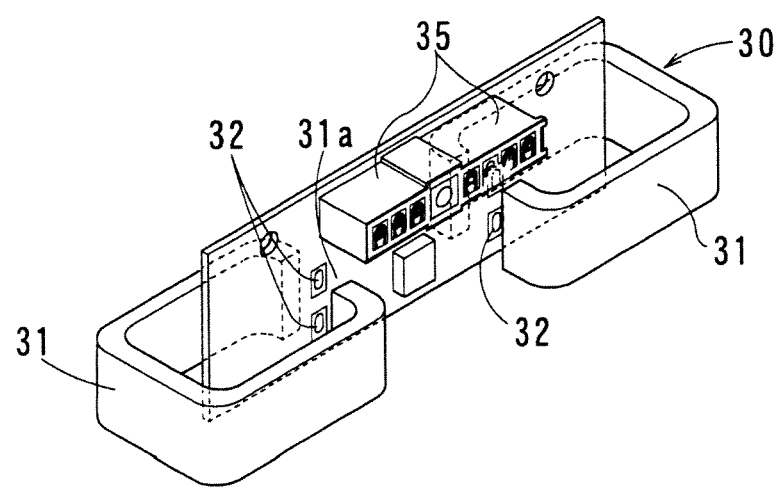
FIG. 8 is a perspective view of the current sensor portion of the relay busbar device.
Figure 9:
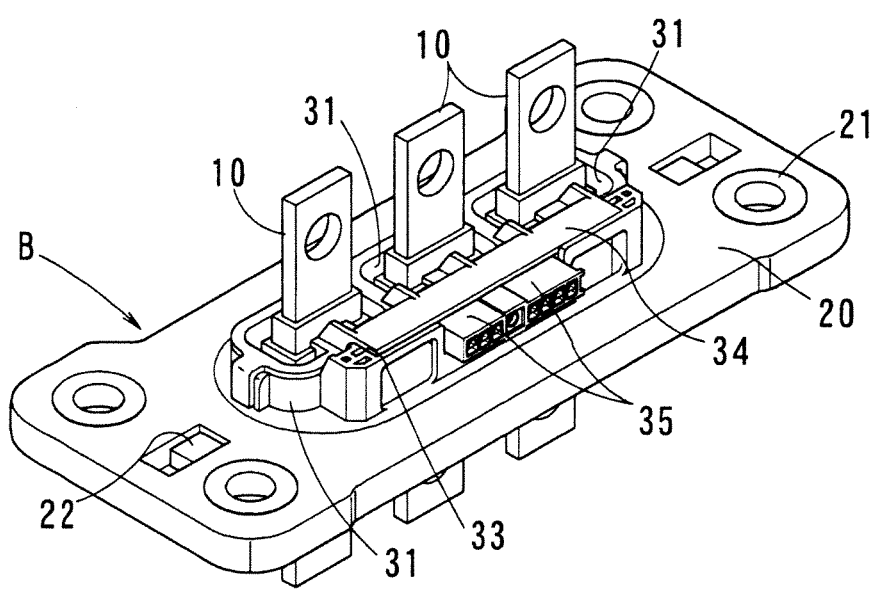
FIG. 9 is a perspective view of the relay busbar device of another embodiment.
Figure 10:
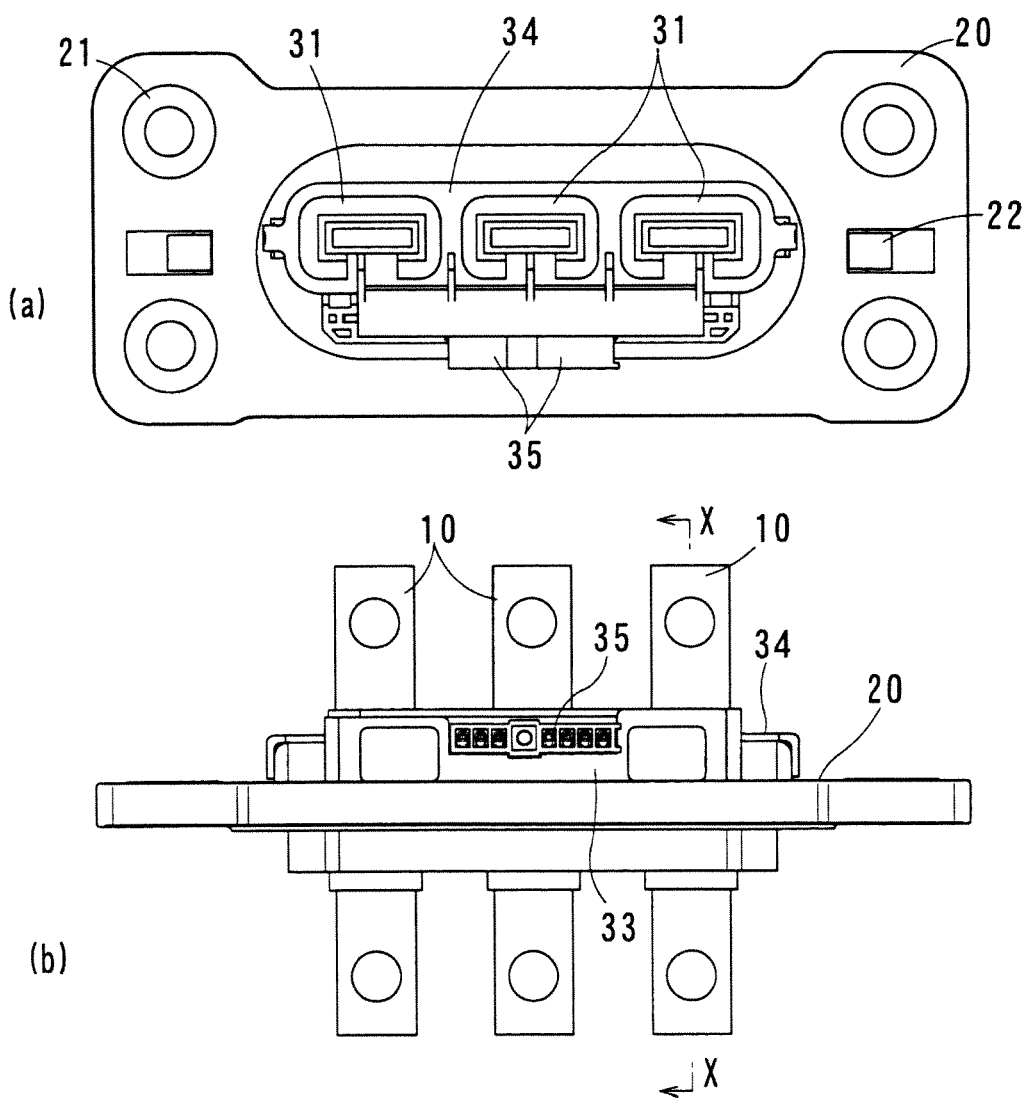
FIG. 10 shows the relay busbar device, in which (a) of FIG. 10 is a plane view and (b) of FIG. 10 is a front view.
Figure 11:
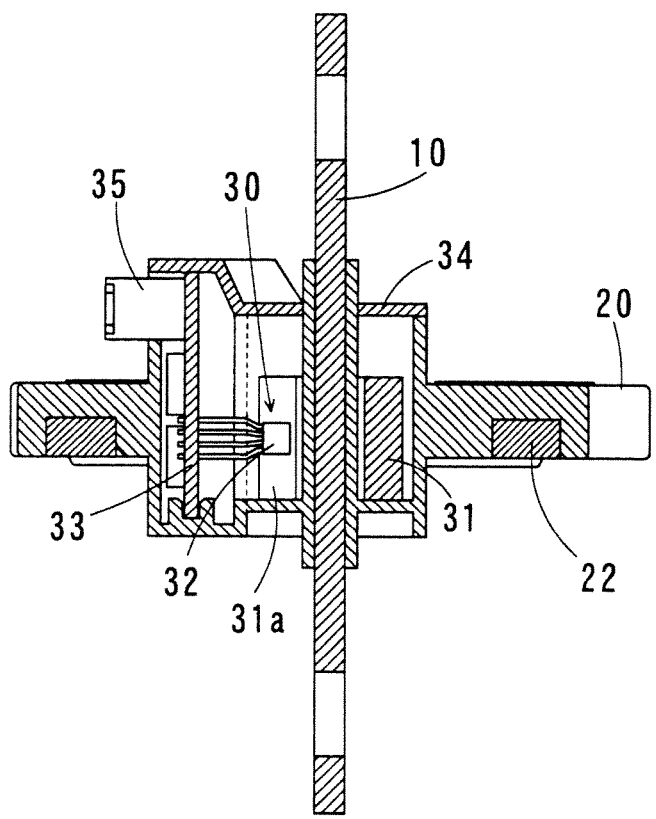
FIG. 11 is a cross-sectional view along line X-X in (b) of FIG. 10.

One embodiment of the invention is shown in FIG. 1 to FIG. 8; as shown in FIG. 1, the relay busbar device B of this embodiment is interposed between a motor casing $C_M$ and an inverter casing $C_I$. The relay busbar device B comprises a relay busbars 10 formed from straight plates; a resin plate (base bracket) 20 through which the relay busbars 10 penetrate perpendicularly, and which is interposed between the two casings; and a current sensor 30 built into the resin plate 20.

Mounting holes are formed in the four corners of the resin plate 20, collars 21 are fitted into the holes, and by interposing between the two casings $C_M$ and $C_I$ and passing bolts through the collars 21 and fastening with nuts, the resin plate 20 is fastened to both of the casings $C_M$ and $C_I$ or to one of the casings. At this time, a rubber seal ring (packing) 22 is fitted onto the surface of the resin plate 20 on the side of the motor casing $C_M$, and the intrusion of motor lubricating oil is prevented by this seal ring 22.

Three relay busbars 10 are arranged in parallel to form a three-phase power circuit; U-shape compacted powder cores 31, forming a current sensor 30, are provided surrounding the relay busbars 10 and 10 on both sides. The relay busbars 10 and the cores 31 are integrally molded with the resin plate 20 at the time of resin molding.

At the time of molding, an interface sealing material is applied to the surfaces of the relay busbars 10 and the cores 31, to secure close adhesion with the resin plate 20. It is preferable that protrusions, protruding stripes, depressed stripes, and similar be formed on the relay busbars 10 and cores 31 to prevent removal (see the symbol 12 for the relay busbars 10 in FIG. 7).

Both the ends 11a and 11b of the relay busbars 10 protrude into the two casings $C_M$ and $C_I$, and power output terminals from the inverter are connected to the ends 11a, while the motor power input terminals are connected to the other ends 11b. These connections may be made via cables or busbars, but the ends 11a and 11b are formed to enable easy connection by means of built-in square nuts, by press-fitting pierce nuts, or similar.

Hall elements 32 are positioned in the removed portions 31a of the cores 31, and the Hall elements 32 are mounted on a detection circuit substrate 33. The circuit substrate 33 is fitted from above into the resin plate 20 and fastened with screws, and the resin cover 34 is fitted into the resin plate 20 to fasten the resin plate 20.

The Hall elements 32 detect magnetic field changes occurring in the core removed portions 31a according to changes in the currents flowing in the relay busbars 10, and based on the detection signals, current measurement values are sent from the circuit substrate 33 to the inverter PCU via connectors 35 and similar. Two Hall elements 32 are provided, above and below, in each core removed portion 31a, to improve detection precision, and so that in the event that one element fails, effective detection by the other is possible (a dually redundant detection circuit is used).

Further, in this embodiment two phases (the current values of the two relay busbars 10 on both ends) are detected, and the current value of the other phase (the other relay busbar 10 in the center) is calculated from the two detected values (current values).

Figure 12:
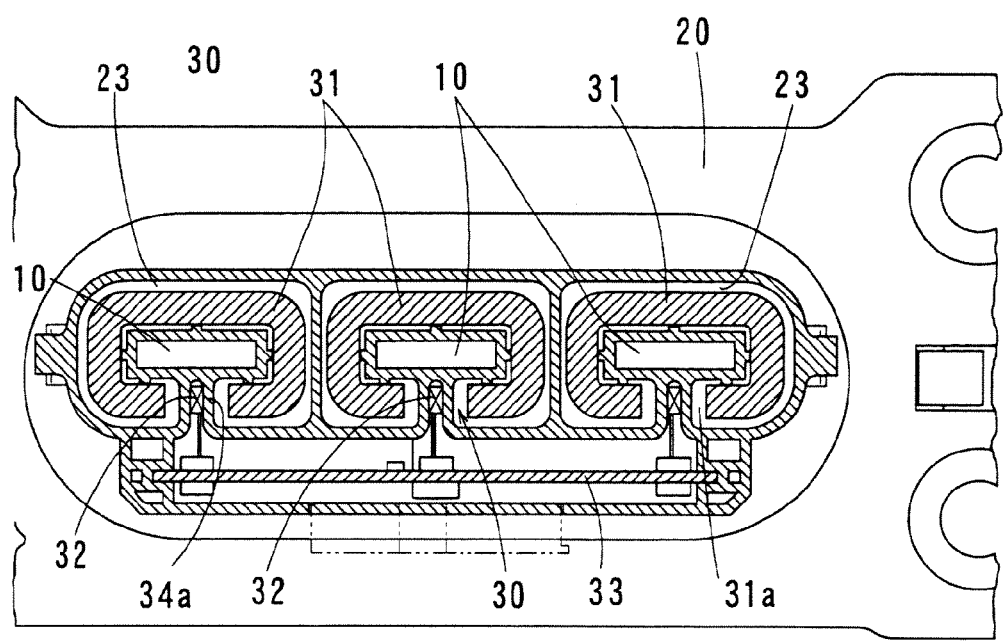
FIG. 12 is a partially sectioned plane view of the relay busbar device.
Figure 13:
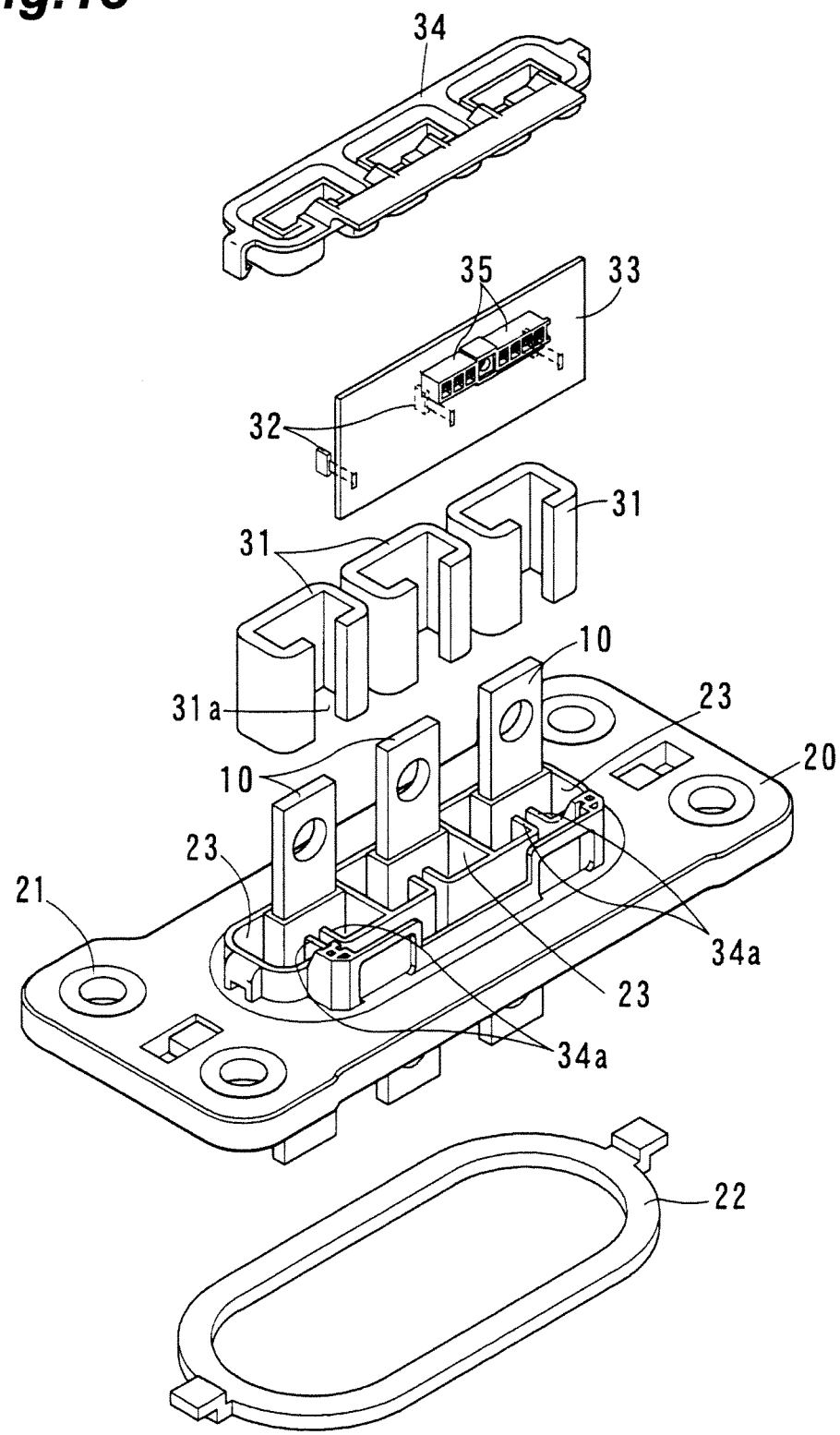
FIG. 13 is an exploded perspective view of the relay busbar device.

In the above embodiment, cores 31 were mounted at the time of mold-forming of the resin plate 20; but as shown in FIG. 9 to FIG. 13, core fitting holes 23 may be formed in the resin plate 20, and the cores 31 may be fitted into and fastened to the holes 23 (the resin covering portion of the relay busbars 10), to mount the cores 31 on the resin plate 20. When performing this fitting, application of an interface sealing material onto core surfaces is unnecessary. As shown in FIG. 12, cores 31 can be provided on all the relay busbars 10, 10, and 10 to enable detection of the current values of all three phases. In the embodiment shown in FIG. 9 to FIG. 13, Hall elements 32 are provided protruding from the detection circuit substrate 33, and positioning tabs (clamping tabs) 34*a* for the Hall elements 32 are provided on the resin plate 20. Further, fastening of the substrate 33 is achieved by covering with and fitting the resin cover 34 into the resin plate 20.

As indicated in each of the embodiments, in a vehicle adopting a structure in which the inverter and motor may both be housed in the same casing, or in which the two casings are in contact, the relay busbar and core base is formed of a resin plate, and the relay busbar is integrally mold-formed with the resin plate during resin molding thereof, so that a relay busbar device with built-in current sensor for the power circuits of inverters and motors can be made small.

In each of the embodiments, a seal ring 22 can also be provided on the face of the resin plate 20 on the inverter side. The shape of the magnetic core 31 is not limited to a U-shape, but may be a ring shape, an ellipse shape, or another arbitrary shape.

Thus the embodiments disclosed herein should be regarded as merely exemplifications which do not limit the scope of the invention. The scope of the invention is indicated in the scope of claims, and is intended to include all modifications which are equivalent to and within the scope of the claims.

What is claimed is:

1. A relay busbar device with a built-in current sensor, which is interposed between a motor casing and an inverter casing, comprising:

a relay busbar, both ends of which enter into both of the casings;

a resin plate, through which the relay busbar penetrates, and which is interposed between the two casings;

a magnetic core, positioned within the resin plate and surrounding the relay busbar; and a magnetic sensor, provided in a removed portion of the magnetic core, wherein the relay busbar is mold-formed integrally with the resin plate during resin molding thereof, and incorporates therein a current sensor in which a change in magnetic field occurring in the removed portion due to current flowing in the relay busbar is detected by the magnetic sensor and a value of the current flowing in the relay busbar is measured.

2. The relay busbar device according to claim 1, wherein packing surrounding a substrate on which are mounted the relay busbar, the magnetic core and the magnetic sensor is provided on a face of the resin plate on the motor side, and leakage of motor lubricating oil from the motor interior to the outside is prevented by the packing.

3. The relay busbar device according to claim 2, wherein a circuit substrate on which the magnetic sensor is mounted is built into the resin plate, and by covering the circuit substrate with a resin cover and fitting the resin cover into the resin plate, the circuit substrate is positioned and fastened.

4. The relay busbar device according to claim 1, wherein an interface sealing material is applied to a surface of the relay busbar, and close adhesion between the relay busbar and the resin plate is secured.

5. The relay busbar device according to claim 1, wherein the magnetic core is also mold-formed integrally with the resin plate during resin molding thereof.

6. The relay busbar device according to claim 5, wherein an interface sealing material is applied to a surface of the magnetic core, and close adhesion between the magnetic core and the resin plate is secured.

7. The relay busbar device according to claim 1, wherein a space enabling insertion of the magnetic core is formed in the resin plate, and the magnetic core is fitted into the space and fastened, and is thereby built into the space.

8. The relay busbar device according to claim 1, wherein the magnetic core is formed of a compacted powder magnetic member.

\* \* \* \* \*